United States Patent
Pahkala

(10) Patent No.: US 11,595,049 B1
(45) Date of Patent: Feb. 28, 2023

(54) PERIOD ERROR CORRECTION IN DIGITAL FREQUENCY LOCKED LOOPS

(71) Applicant: TEXAS INSTRUMENTS INCORPORATED, Dallas, TX (US)

(72) Inventor: Janne Matias Pahkala, Oulu (FI)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/710,650

(22) Filed: Mar. 31, 2022

(51) Int. Cl.
 *H03L 7/093* (2006.01)
 *H03L 7/099* (2006.01)
 *G01S 7/03* (2006.01)

(52) U.S. Cl.
 CPC .............. *H03L 7/093* (2013.01); *H03L 7/099* (2013.01); *G01S 7/03* (2013.01)

(58) Field of Classification Search
 CPC ............ H03L 7/093; H03L 7/099; G01S 7/03
 See application file for complete search history.

(56) References Cited

U.S. PATENT DOCUMENTS

| | | | | |
|---|---|---|---|---|
| 6,566,967 B1 * | 5/2003 | Anumula | ................ | H03L 7/087 331/11 |
| 6,833,767 B1 * | 12/2004 | Huff | .................... | H03C 3/0991 331/23 |
| 7,279,988 B1 * | 10/2007 | Janesch | .................... | H03L 7/08 331/10 |
| 8,604,840 B2 * | 12/2013 | Ahmadi | ................ | H03L 7/1976 327/107 |
| 9,793,906 B1 * | 10/2017 | Midha | ...................... | H03L 7/083 |
| 9,893,876 B2 * | 2/2018 | Moehlmann | .......... | H04L 7/0331 |
| 10,008,980 B2 * | 6/2018 | Bashir | ................... | H03L 7/1976 |
| 11,038,521 B1 * | 6/2021 | Rafi | .................... | H03M 7/3024 |
| 11,075,638 B1 * | 7/2021 | Sinha | ...................... | H03L 7/103 |
| 11,418,204 B2 * | 8/2022 | Gupta | ..................... | H03L 7/093 |
| 11,456,750 B2 * | 9/2022 | Lin | ....................... | H03L 7/1976 |
| 2008/0055007 A1 * | 3/2008 | Biedka | .................. | H03C 3/095 331/23 |
| 2011/0063003 A1 * | 3/2011 | Friedman | ................ | H03L 7/089 327/159 |
| 2013/0257494 A1 * | 10/2013 | Nikaeen | ................. | H03L 7/085 327/156 |
| 2014/0232475 A1 * | 8/2014 | Elkholy | .................... | H03L 7/16 331/44 |
| 2015/0002198 A1 * | 1/2015 | Jin | .......................... | H03L 7/093 327/159 |

\* cited by examiner

*Primary Examiner* — Adam D Houston
(74) *Attorney, Agent, or Firm* — Valerie M. Davis; Frank D. Cimino

(57) ABSTRACT

In some examples, a digital frequency locked loop (DFLL) device includes a phase frequency detector (PFD) configured to receive a reference clock signal and an indicator of a primary clock signal and to determine differences between periods of the reference clock signal and the indicator. The DFLL also includes a controller coupled to the PFD. The controller is configured to store digital signals indicating a first and a second of the differences determined by the PFD, determine a period error by subtracting the second difference from the first difference, and compare the period error to a programmed threshold. The DFLL also includes a digitally controlled oscillator (DCO) coupled to the controller, the DCO configured to provide the primary clock signal having a frequency adjusted based on the comparison.

20 Claims, 12 Drawing Sheets

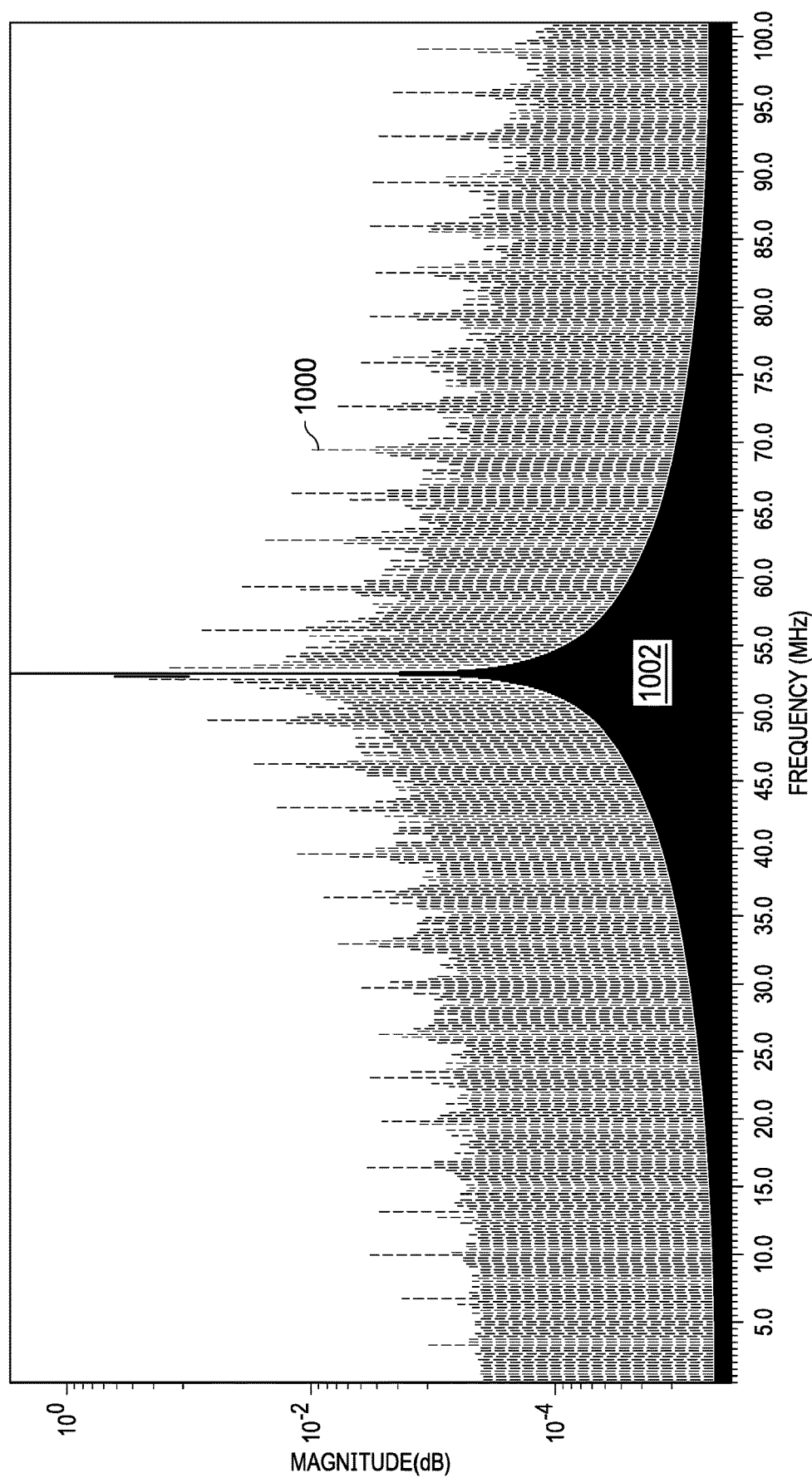

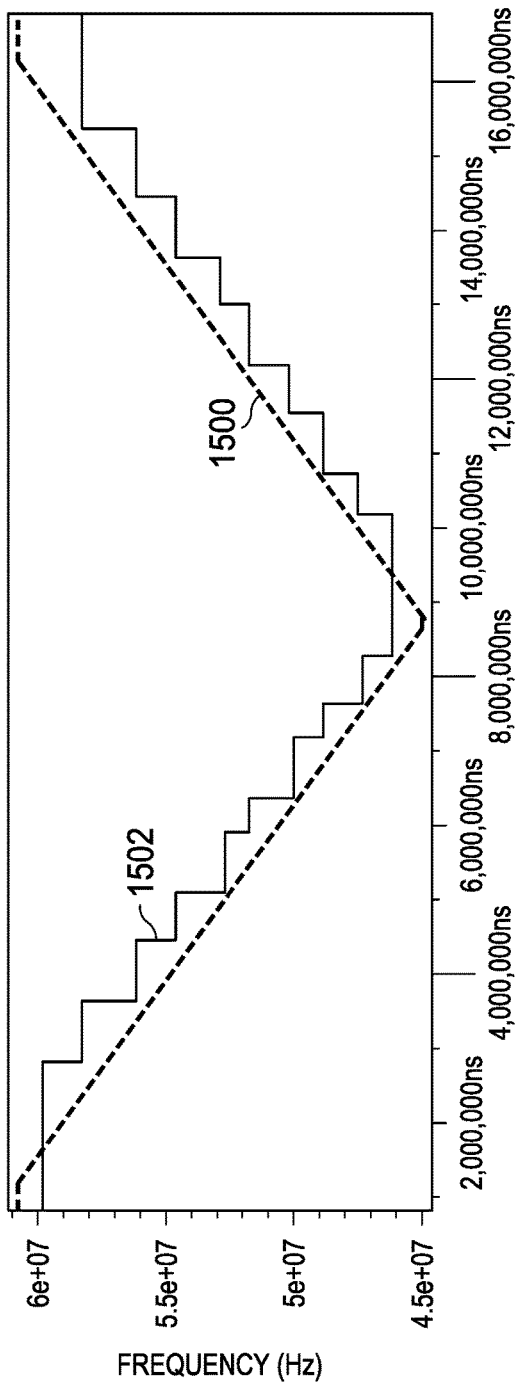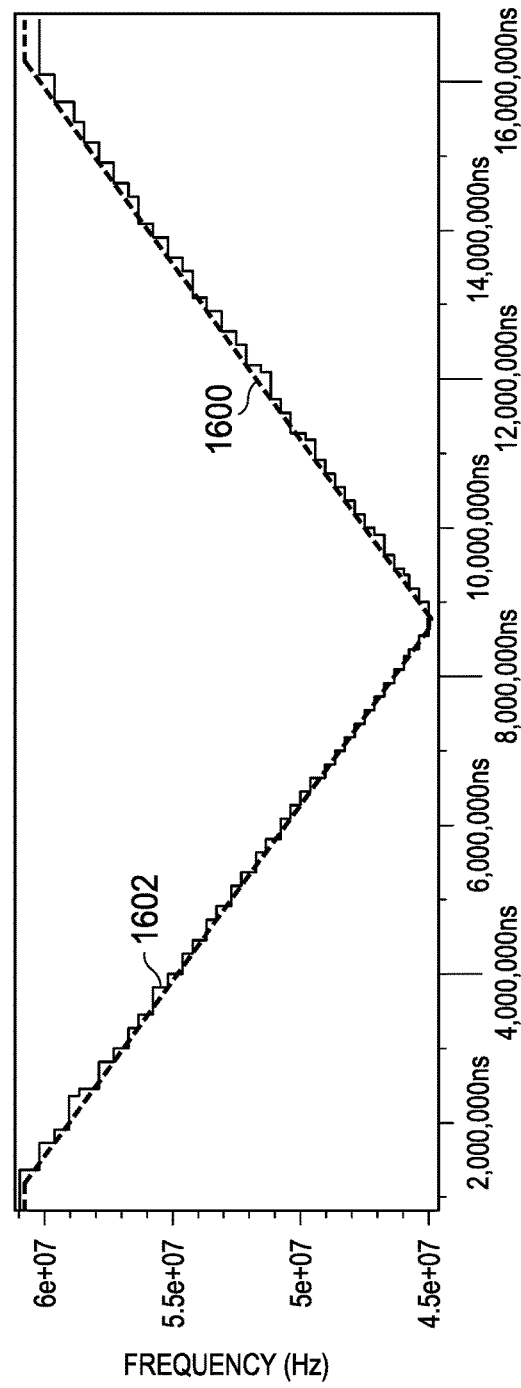

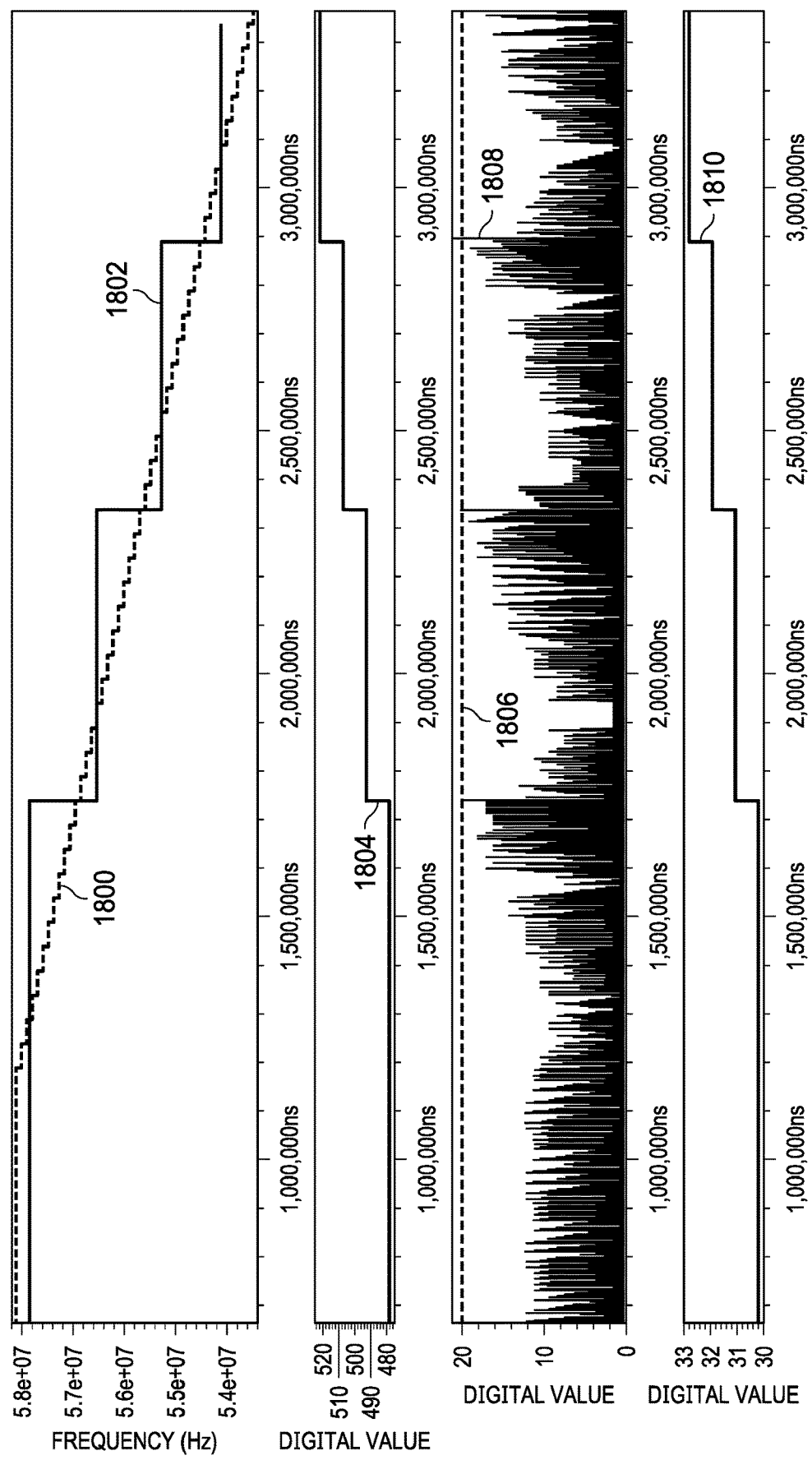

PERIOD ERROR CORRECTION IN DIGITAL FREQUENCY LOCKED LOOPS

BACKGROUND

Some radar devices contain power management integrated circuits (PMICs), that may include power converters, such as buck converters. Because of the radar context in which the PMICs are implemented, the PMICs preferably provide power with low-ripple voltages. PMICs that provide high-ripple voltages often include additional components, such as low-dropout regulators (LDO regulators) or inductor-capacitor (LC) filters, to reduce ripple voltage.

SUMMARY

In some examples, a digital frequency locked loop (DFLL) device includes a phase frequency detector (PFD) configured to receive a reference clock signal and an indicator of a primary clock signal and to determine differences between periods of the reference clock signal and the indicator. The DFLL also includes a controller coupled to the PFD. The controller is configured to store digital signals indicating a first and a second of the differences determined by the PFD, determine a period error by subtracting the second difference from the first difference, and compare the period error to a programmed threshold. The DFLL also includes a digitally controlled oscillator (DCO) coupled to the controller, the DCO configured to provide the primary clock signal having a frequency adjusted based on the comparison.

BRIEF DESCRIPTION OF THE DRAWINGS

FIGS. 6-10 are a set of graphs depicting various functional aspects of the DFLL structures described herein, in accordance with various examples.

FIG. 13 is a graph depicting the operation of a DFLL in accordance with various examples.

The same reference numbers or other reference designators are used in the drawings to designate the same or similar (functionally and/or functionally) features.

DETAILED DESCRIPTION

Figure 1:
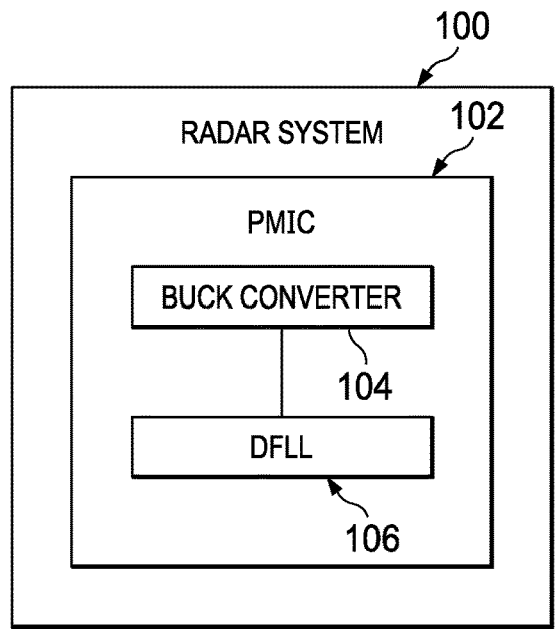
FIG. 1 is a block diagram of a radar system in accordance with various examples.

As described above, some radar devices (e.g., radar devices used in automotive, industrial and/or personal electronics) contain PMICs that provide high-ripple voltages. Such high-ripple voltages are often the result of the clocks used by the PMICs. More specifically, the PMIC buck converters use multiple switch clocks to provide power. The switch clocks control the switching action of the buck converters. The switch clock signals may sometimes contain spurs, and these spurs can lead to the undesirable ripple voltages described above. High frequency spurs, particularly those in the range of, for example, 10 kHz-15 MHz, can be particularly problematic for radar systems.

The switch clock signals are usually generated using a primary clock signal generated by a DFLL device or a digital phase locked loop (DPLL) device (for simplicity, the remainder of this description assumes the use of a DFLL device). More specifically, the DFLL device produces the primary clock signal, which, in turn, is divided to produce the switch clock signals. Because the switch clock signals are preferably spur-free, the primary clock signal used to produce the switch clock signals also should be spur free. Mitigating the presence of spurs in the primary clock signal produced by the DFLL device, however, is challenging because of the manner in which the DFLL device adapts the primary clock signal to a reference clock signal. Specifically, the DFLL device continuously adjusts the frequency of the primary clock signal based on the frequency of the reference clock signal. This continuous adjustment is performed to compensate for errors in the DFLL device, such as small frequency errors caused in primary and feedback clock signals by the frequency quantization performed by digitally controlled oscillators (DCOs) (this quantization error may also be mitigated by dithering the DCO frequency selection between two adjacent values), as well as phase errors of the reference and primary clock signals that cause inaccurate frequency error measurement by the DFLL device. This continuous adjustment of the primary clock signal frequency and the DCO frequency selection dithering described above result in a spurious primary clock signal. The spurious primary clock signal, in turn, results in spurious switch clock signals and, by extension, buck converter outputs having high ripple at the frequencies of the spurs.

This description provides various examples of a DFLL device that mitigates the challenges described above. More specifically, the DFLL device described herein produces a primary clock signal that is approximately spur-free (or substantially spur-free), and the spur-free primary clock signal is useful to power supplies (e.g., buck converters) to produce voltages with minimal or no ripple below the switching frequency of the power supplies. To produce a spur-free primary clock signal, the DFLL device may compare the difference in periods of the primary clock and reference clock signals to a programmed threshold, and the DFLL device adjusts the frequency of the primary clock signal when (e.g., only when) the difference in periods exceeds the threshold. Adjusting the primary clock signal frequency in this manner mitigates spurs because the primary clock signal is no longer being continuously adjusted in the manner of the prior solutions.

Determining an accurate difference between the periods of the primary clock and reference clock signals (for subsequent comparison to the programmed threshold) can be challenging, because the calculated difference still includes a degree of phase error. Unless the phase error is removed, the calculated difference between the periods of the primary clock and reference clock signals will not be accurate. With an inaccurate calculation of the difference in periods, the mitigation of spurs using the technique described herein may still be challenging. One may attempt to compensate for this inherent phase error by adjusting the threshold against which the calculated difference in periods is compared. However, decreasing the threshold can mimic or approximate continuous frequency adaptation of the primary clock signal to the reference clock signal, which, as described above, results in spurs in the primary clock signal. Conversely, increasing the threshold can cause poor adaptation of the primary clock signal to the reference clock signal. This description provides various examples of a technique whereby the phase error may be removed from the calculated difference in periods between the primary clock and reference clock signals. Thus, an accurate difference in periods is produced for comparison against the programmed threshold. With the use of an accurate difference in periods devoid of phase error, a primary clock signal is produced without spurs and the programmed threshold is left unperturbed, thereby negating the above-described risks inherent to increasing or decreasing the threshold to compensate for phase error.

These examples are described with reference to the drawings.

FIG. 1 is a block diagram of a radar system 100 in accordance with various examples. In some examples, the radar system 100 may be an automotive radar apparatus, such as lane change assist, blind spot detection, automatic emergency braking, adaptive cruise control, and cross traffic alert technologies. In examples, the radar system 100 may operate in a frequency range of 10 kHz to 25 MHz. The example radar system 100 may include a PMIC 102, a receiver (not shown), a transmitter (not shown), a transceiver, a processor and/or other analog or digital circuitry (not shown), amplifiers (not shown), filters (not shown) and/or one or more antenna (not shown). For example, the PMIC 102 may be positioned on a printed circuit board within a component of the radar system 100. The PMIC 102 may include (or be connected to) one or more power supplies, such as switched mode power supplies. For instance, the PMIC 102 may include one or more buck converters, boost converters, buck-boost converters, or combinations thereof. An example buck converter 104 is shown as being included in the PMIC 102. Like other SMPSs, the buck converter 104 may receive a clock signal to control the switching action of the buck converter 104. The PMIC 102 may include a DFLL 106 configured to provide such a clock signal to the buck converter 104. For instance, the DFLL 106 may provide a primary clock signal that is subsequently divided (e.g., by circuitry, such as a clock divider, on the PMIC 102) to produce switch clock signals, and the switch clock signals may be provided to the SMPSs, such as the buck converter 104, to control the SMPSs' switching action. In some examples, the DFLL 106 may be replaced by a DPLL, where the DPLL is configured to perform similar actions as those attributed herein to the DFLL 106.

Figure 2B:
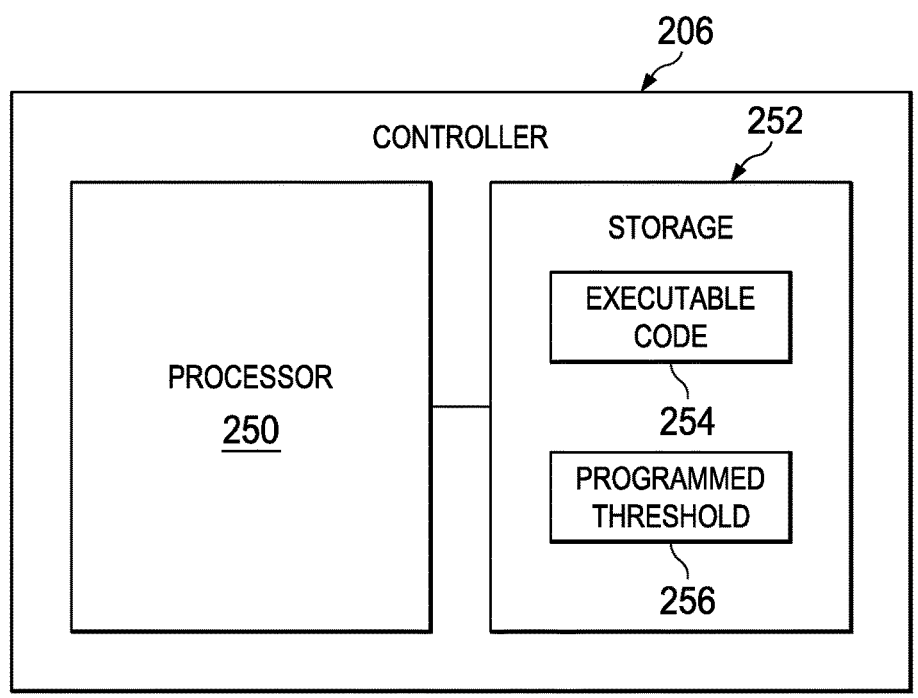
FIG. 2B is a block diagram of a controller in a DFLL in accordance with various examples.
Figure 2A:
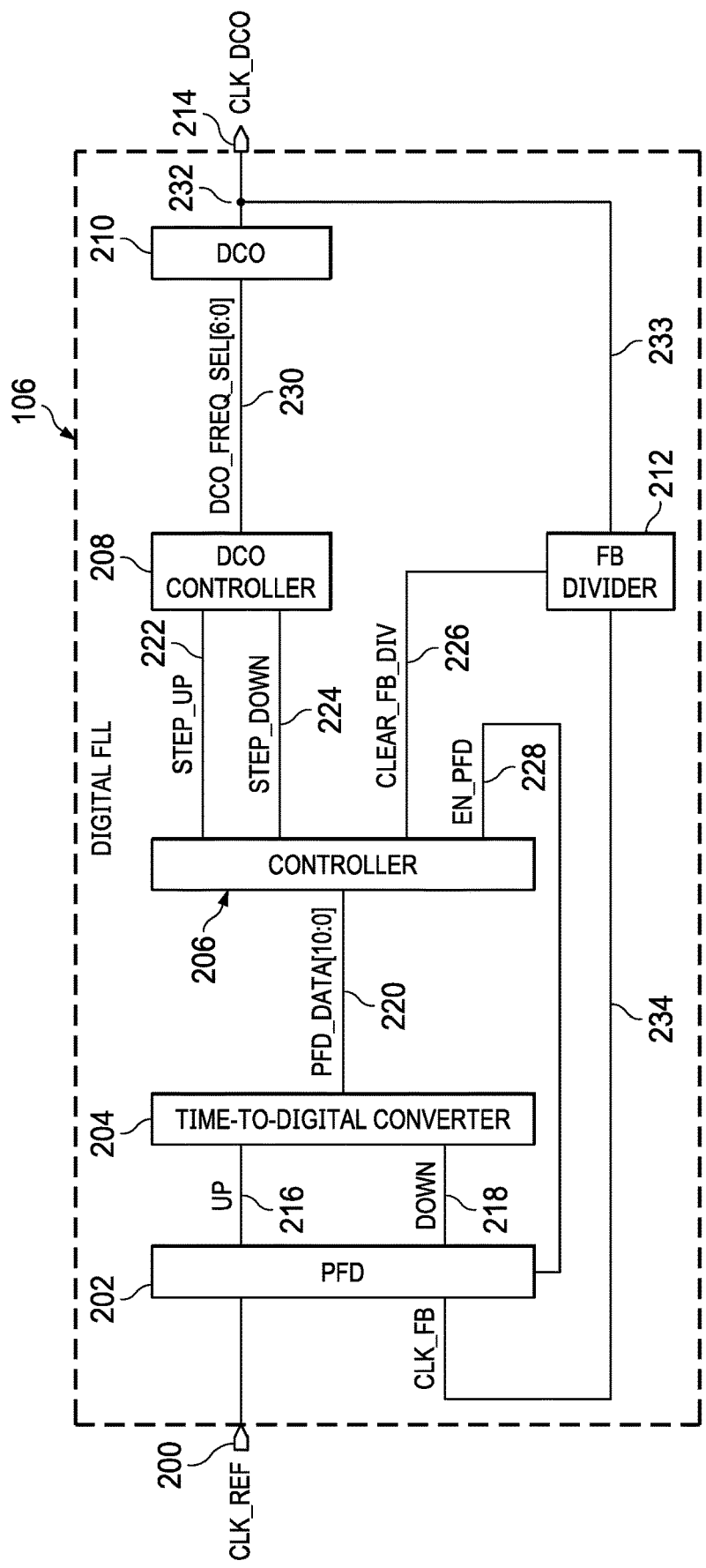
FIG. 2A is a block diagram of a digital frequency locked loop (DFLL) in accordance with various examples.

FIG. 2A is a block diagram of the DFLL 106 in accordance with various examples. The example DFLL 106 shown in FIG. 2A may be implemented in the radar system 100 of FIG. 1, although the scope of this disclosure is not limited to the use of the DFLL 106 of FIG. 2A in the radar system 100 of FIG. 1. The example DFLL 106 in FIG. 2A may include an input 200, a phase frequency detector (PFD) 202 coupled to the input 200, and a time-to-digital converter (TDC) 204 coupled to the PFD 202. The DFLL 106 may further include a controller 206 coupled to the TDC 204 and a digitally-controlled oscillator (DCO) controller 208 coupled to the controller 206. In examples, the DFLL 106 may include a DCO 210 coupled to the DCO controller 208, a feedback divider 212 coupled to the controller 206 and the DCO 210, and an output 214 coupled to the DCO 210 and the feedback divider 212. More particularly, the PFD 202 may be coupled to the TDC 204 by way of an up connection 216 and a down connection 218. The TDC 204 may be coupled to the controller 206 by way of a PFD_DATA connection 220, which may be a multi-conductor bus or other type of connector. The controller 206 may be coupled to the DCO controller 208 by way of a STEP_UP connection 222 and a STEP_DOWN connection 224. The controller 206 may also be coupled to the feedback divider 212 by way of a CLEAR_FB_DIV connection 226 and to the PFD 202 by way of an EN_PFD connection 228. The DCO controller 208 may be coupled to the DCO 210 by way of a DCO_F-REQ_SEL connection 230, which may be a multi-conductor bus or other type of connector. A node 232 may be coupled to the DCO 210, the output 214, and the feedback divider 212. The node 232 couples to the feedback divider 212 by way of a connection 233. The feedback divider 212 may be coupled to the PFD 202 by way of a CLK_FB connection 234.

In an example operation, a reference clock signal CLK_REF is provided on the input 200. The PFD 202 may receive the CLK_REF signal. The PFD 202 may also receive the a feedback clock signal CLK_FB on the CLK_FB connection 234. The PFD 202 may compare the reference clock signal CLK_REF to the feedback clock signal CLK_FB to determine a difference in phase between the signals, a difference in frequency between the signals, a time (e.g., period) difference between the signals, or any combination thereof. The PFD 202 may provide pulses on the up and down connections 216, 218 that indicate the determined difference in phase and/or frequency. More specifically, the up signal pulse width (e.g., on the up connection 216) may indicate how much sooner a rising edge of the reference clock signal CLK_REF occurred relative to a next feedback clock signal CLK_FB rising edge, and the down signal pulse width (e.g., on the down connection 218) may indicate how much sooner the CLK_FB rising edge occurred relative to the next CLK_REF rising edge. The TDC 204 may receive the pulses on the up and down connections 216, 218 and generate a digital signal PFD_DATA on the PFD_DATA connection 220 based on the temporal durations of the pulses on the up and down connections 216, 218. The digital signal PFD_DATA may indicate to the controller 206 a time (e.g., period) difference between CLK_REF and CLK_FB. A bit in the digital signal PFD_DATA on the PFD_DATA connection 220 may indicate whether the CLK_FB rising edge occurred sooner than CLK_REF, which determines how the frequency of the CLK_DCO signal should be adjusted (e.g., increased or decreased). The controller 206, in turn, may assert a STEP_UP signal on the STEP_UP connection 222 or a STEP_DOWN signal on the STEP_DOWN connection 224, depending on whether the frequency of the primary clock signal CLK_DCO is to be increased or decreased, respectively. The DCO controller 208 may provide a DCO control signal DCO_FREQ_SEL on the DCO_FREQ_SEL connection 230 to the DCO 210, and this control signal may cause the DCO 210 to increase or decrease the frequency of the primary clock signal CLK_DCO. The feedback divider 212 may receive the primary clock signal CLK_DCO and divide it by a feedback divider value to produce CLK_FB, which is a lower frequency version of CLK_DCO. PFD 202 may compare CLK_FB and CLK_REF as described above. For example, CLK_REF may have a frequency of 1 MHz, and CLK_FB may have a frequency of approximately 1 MHz. If CLK_FB rises slightly to 1.5 MHz, the DFLL 106 may cause the DCO 210 to lower the frequency of CLK_DCO such that the CLK_FB provided by the feedback divider 212 falls from 1.5 MHz to approximately 1 MHz. Conversely, if CLK_FB falls slightly to 0.7 MHz, the DFLL 106 may cause the DCO 210 to increase the frequency of CLK_DCO such that the CLK_FB provided by the feedback divider 212 rises from 0.7 MHz to approximately 1 MHz, thereby matching the 1 MHz CLK_REF.

FIG. 2B is a block diagram of a controller, such as the controller 206, in a DFLL in accordance with various examples. The example controller 206 may include a processor 250 and storage 252 (e.g., memory) coupled to the processor 250. In examples, the storage 252 may include executable code 254, which, when executed by the processor 250, causes the processor 250 to perform some or all of the actions attributed herein to the controller 206. The storage 252 also may include a programmed threshold 256 that is useful to the processor 250 to adapt the frequency of the primary clock signal CLK_DCO of the DFLL based on the reference clock signal CLK_REF, as described below. The programmed threshold 256 may be determined as desired by, e.g., an engineer prior to manufacture, and the programmed threshold 256 may be stored to the storage 252 during or after manufacture. In some examples, the programmed threshold 256 may be adjusted after manufacture by an end user of the radar system 100.

In other solutions, a controller may be programmed to continuously adapt the output clock signal of a DFLL in which the controller is included so that the frequency of the feedback clock signal matches that of the reference clock signal. As described above, this type of continuous adaptation results in spurious output clock signals provided by the DFLL. However, in examples described herein, the controller 206 is programmed to avoid continuous adaptation of the primary clock signal CLK_DCO. Instead, the controller 206 may adapt CLK_DCO using a threshold technique. More specifically, the controller 206 may include the programmed threshold 256 against which the controller 206 compares the period difference provided by PFD_DATA. If the PFD_DATA period difference exceeds the threshold 256 programmed in the controller 206, the controller 206 may adjust the STEP_UP or STEP_DOWN signals as appropriate. However, if the PFD_DATA period difference does not exceed the threshold 256, the controller 206 may not adjust the STEP_UP or STEP_DOWN signals. By adjusting CLK_DCO only when PFD_DATA exceeds the threshold 256, CLK_DCO is not continuously adapted as in other solutions and spur formation is mitigated.

Figure 3:
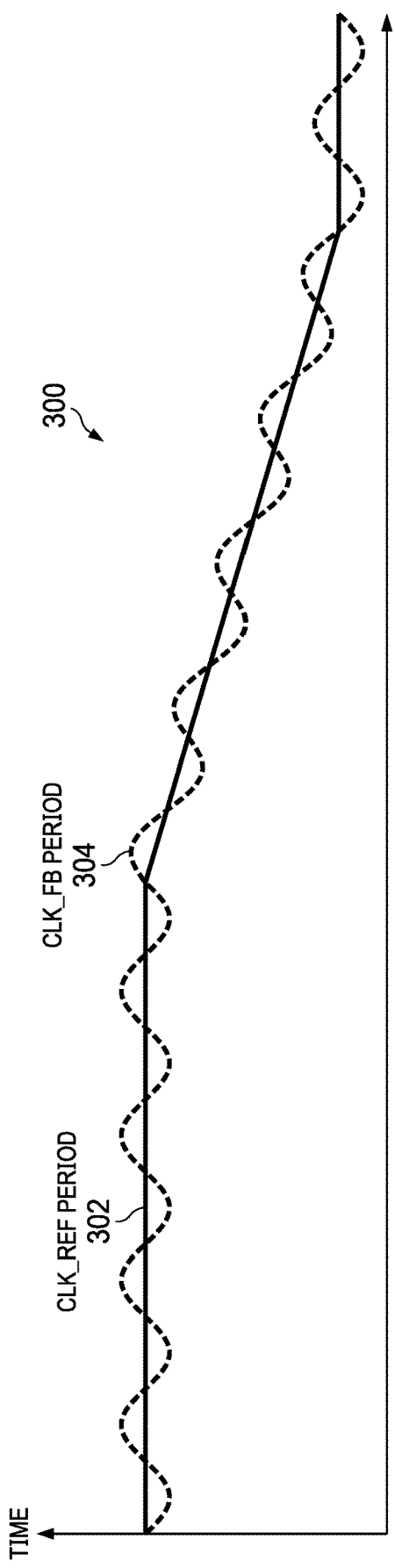
FIG. 3 is a prior art graph depicting continuous adaptation of a primary clock signal provided by a DFLL based on a reference clock signal, in accordance with various examples.

FIG. 3 is a prior art graph 300 depicting continuous adaptation of a primary clock signal provided by a DFLL based on a reference clock signal, in accordance with various examples. The x-axis represents time and the y-axis also represents time. The graph 300 depicts a curve 302 indicating the period for a reference clock signal, and a curve 304 indicating the period for a feedback clock signal. Because period is the inverse of frequency, the curves 302, 304 indirectly indicate the frequency behaviors of their respective clock signals. The sinusoidal appearance of the curve 304 indicates that the primary clock signal used to generate the feedback clock signal is continuously adapted in an effort to match the frequency of the feedback clock signal to that of the reference clock signal.

Figure 4:
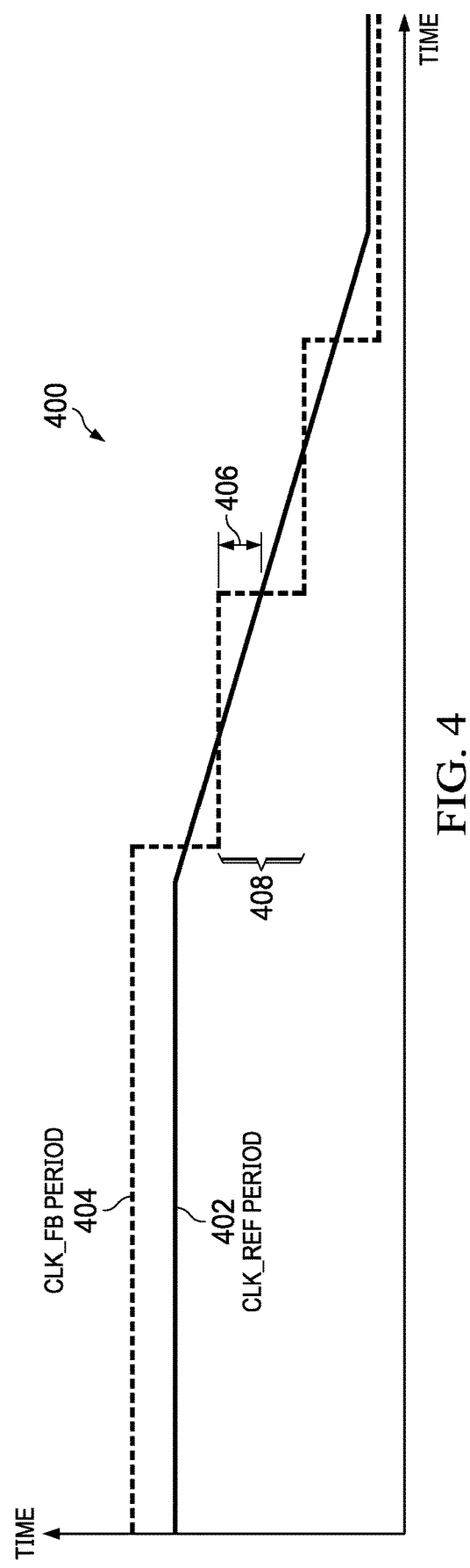
FIG. 4 is a graph depicting the use of a threshold comparison technique when controlling a primary clock signal provided by a DFLL, in accordance with various examples.

In contrast to this continuous adaptation, and in accordance with various examples of this disclosure, FIG. 4 shows a graph 400 depicting the use of a threshold comparison technique when controlling a primary clock signal provided by a DFLL, in accordance with various examples. The x-axis represents time and the y-axis also represents time. More specifically, the graph 400 depicts a curve 402 indicating an example period for a reference clock signal CLK_REF, such as the CLK_REF provided on input 200 of DFLL 106 (FIG. 2A). Further, the graph 400 depicts a curve 404 indicating an example period for a feedback clock signal CLK_FB, such as the CLK_FB provided by the feedback divider 212 of DFLL 106 (FIG. 2A). The behavior of curve 402 is similar to that of curve 302 in FIG. 3. However, unlike curve 304, curve 404 does not indicate a continuous adaptation of the frequency of CLK_FB to that of CLK_REF. Instead, curve 404 indicates that the period (and, therefore, the frequency) of CLK_FB (and, therefore, of CLK_DCO) is maintained at a fixed value until a measured period error between the curves 402, 404 exceeds a threshold. More specifically, when a difference 406 between a current value of CLK_FB and a current value of CLK_REF reaches the programmed threshold 256 (FIG. 2B), the controller 206 adjusts CLK_FB by stepping down or stepping up the period (or an equivalent change in frequency) by a step 408. The size of the step 408 and the size of the programmed threshold 256 may vary. In some examples, the programmed threshold 256 is half, or approximately half, of the size of the step 408.

Referring again to FIG. 2A, the feedback divider 212 may provide the feedback clock signal CLK_FB based on the primary clock signal CLK_DCO provided on the output 214 of the DFLL 106. The feedback divider 212 may be cleared (or reset) by the controller 206 using the CLEAR_FB_DIV connection 226. In some examples, the controller 206 may use the CLEAR_FB_DIV connection 226 to synchronize the rising edges of CLK_FB and CLK_REF. By synchronizing CLK_FB and CLK_REF in this manner, the phase difference between the two clock signals is minimized, particularly if the synchronization is performed immediately prior to measurement of the aforementioned period error (e.g., the first three rising edges of CLK_FB and the first two rising edges of CLK_REF after the synchronization are used to determine the period error). As a result, the dynamic range of the TDC 204 need not be as large as it would otherwise have been. Referring still to FIG. 2A, the controller 206 may use the EN_PFD connection 228 to enable and disable the PFD 202.

To perform the threshold comparison technique described above with reference to FIG. 4, the period error, which is the difference 406 between CLK_REF and a current value of CLK_FB, should be accurately determined so that it may be compared with the programmed threshold 256. As described above, the result of the comparison may then be used to determine whether the period (or frequency) of CLK_FB should be adjusted. Accurately determining the period error, however, may be challenging, because the mere subtraction of the period of one of the CLK_FB and CLK_REF clock signals from the period of the other results in a value that includes an inherent phase error. The phase error may be substantial, and thus the inaccuracy of the calculated period error may be substantial. Accordingly, described below with reference to FIGS. 5A-7 are various techniques for calculating a period error that eliminates, or at least mitigates, the phase error that would otherwise be inherent in the period error calculation.

Figure 5A:
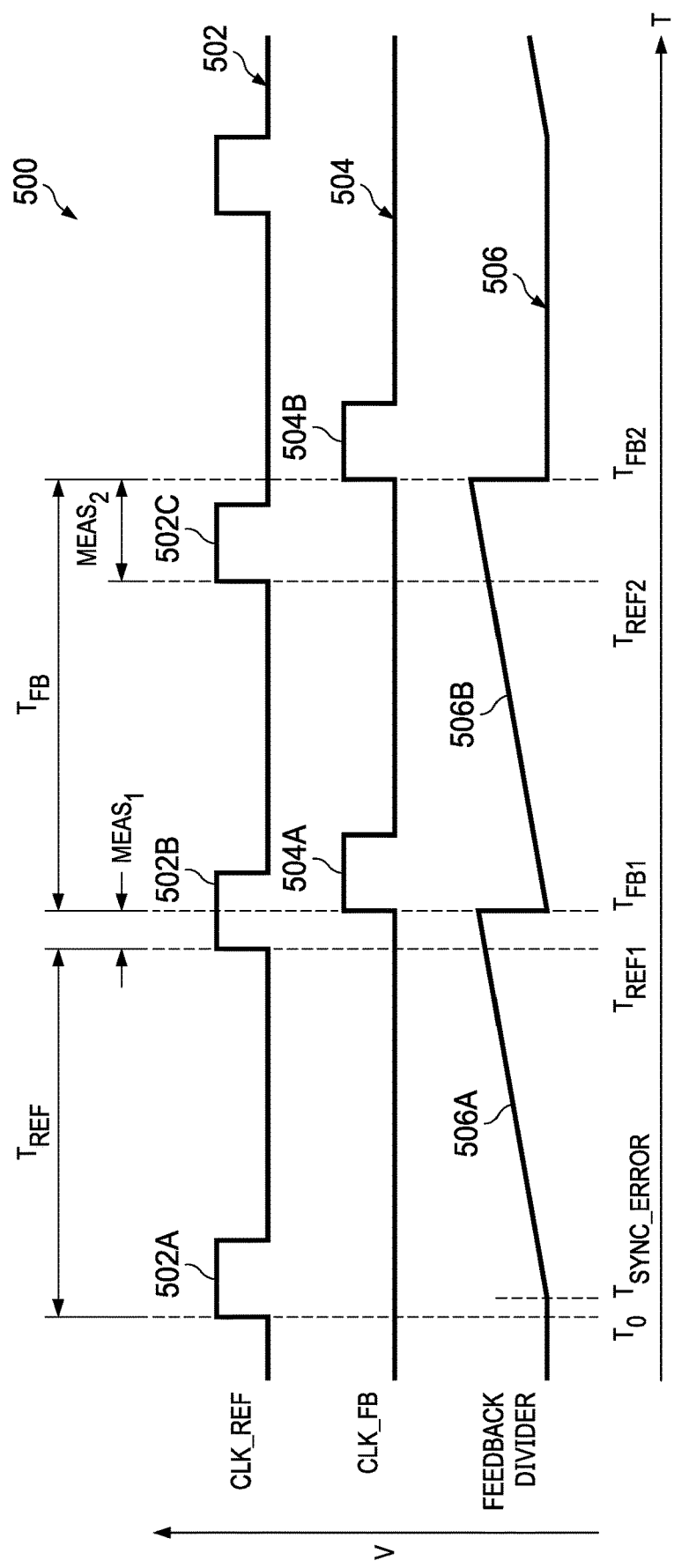
FIG. 5A is a timing diagram depicting a determination of a period error in a DFLL, in accordance with various examples.
Figure 5B:
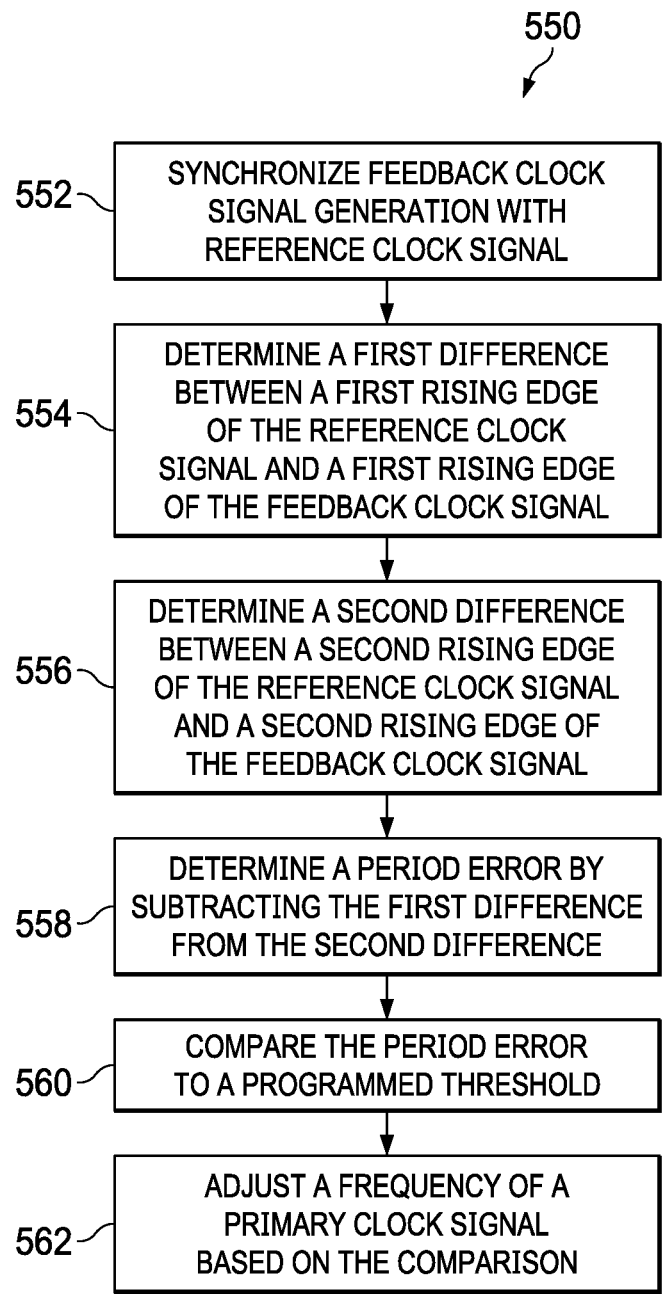
FIG. 5B is a flow diagram of a method for operating a DFLL in accordance with various examples.

FIG. 5A is a graph 500 depicting a determination of a period error in a DFLL, in accordance with various examples. In examples, the controller 206 (FIG. 2A) may perform some or all of the determination of period errors. FIG. 5B is a flow diagram of a method 550 for operating a DFLL, such as the DFLL 106 described above, in accordance with various examples. FIGS. 5A and 5B are now described in parallel. The graph 500 depicts curves 502, 504, and 506, with time on the x-axis and voltage or digital state on the y-axis. Curve 502 represents the behavior of CLK_REF and includes example pulses 502A, 502B, and 502C. Curve 504 represents the behavior of CLK_FB (e.g., on CLK_FB connection 234 of FIG. 2A) and includes example pulses 504A and 504B. Curve 506 represents the behavior of the feedback divider 212 (FIG. 2A) and includes ramps 506A and 506B. The graph 500 expressly identifies six individual points in time: T0, TSYNC_ERROR, TREF1, TFB1, TREF2, and TFB2. T0 represents a baseline time relative to which the other points in time are referenced. T0 also coincides with the rising edge of pulse 502A. TSYNC_ERROR is a time at which the feedback clock generation synchronization with the CLK_REF is complete. TREF1 coincides with the rising edge of pulse 502B. TFB1 coincides with the rising edge of pulse 504A. TREF2 coincides with the rising edge of pulse 502C. TFB2 coincides with the rising edge of pulse 504B. The pulses 502A, 502B and 502C may be consecutive and the pulses 504A and 504B may be consecutive.

The method 550 may begin with the controller 206 (FIG. 2A) synchronizing the feedback clock signal CLK_FB generation with the reference clock signal CLK_REF (552), as described above. In an example, the controller 206 may perform this synchronization by delaying the feedback clock generation by one or more CLK_DCO periods after the rising edge of pulse 502A. In FIG. 5A, TSYNC_ERROR depicts this synchronization, with the ramp 506A rising one or more CLK_DCO periods after T0. Step 552 is not essential, but it may be performed to reduce the dynamic range requirement of the TDC 204 (FIG. 2A).

The method 550 may include determining a first difference between a first rising edge of the reference clock signal CLK_REF and a first rising edge of the feedback clock signal CLK_FB (in step 554). Stated another way, the controller 206 may determine a time difference MEAS1 between the rising edge of pulse 502B and the rising edge of pulse 504A. MEAS1 is equivalent to TFB1 subtracted from TREF1:

$$MEAS1 = TREF1 - TFB1 \quad (1)$$

Further, TREF1 is equivalent to the sum of the baseline T0 and the time elapsed between the baseline T0 and TREF1, which is TREF:

$$TREF1 = T0 + TREF \quad (2)$$

Further, TFB1 is equivalent to the sum of the baseline T0, TSYNC_ERROR, and TFB, with TFB representing a period of CLK_FB:

$$TFB1 = T0 + TSYNC\_ERROR + TFB \quad (3)$$

Thus, by substitution and simplification, MEAS1 is equivalent to:

$$MEAS1 = (T0 + TREF) - (T0 + TSYNC\_ERROR + TFB) \quad (4)$$

$$MEAS1 = TREF - TSYNC\_ERROR - TFB \quad (5)$$

In examples, the PFD 202, the controller 206, and a feedback divider 212 (FIG. 2) are configured to be cleared prior to the determination of the first difference. The method 550 may include determining a second difference between a second rising edge of the reference clock signal and a second rising edge of the feedback clock signal (in step 556). Stated another way, the controller 206 may determine a time difference MEAS2 between the rising edge of pulse 502C and the rising edge of pulse 504B. MEAS2 is equivalent to TFB2 subtracted from TREF2:

$$MEAS2 = TREF2 - TFB2 \quad (6)$$

Further, TREF2 is equivalent to the sum of baseline T0 and two periods of CLK_REF:

$$TREF2 = T0 + 2TREF \quad (7)$$

Further, TFB2 is equivalent to the sum of the baseline T0, TSYNC_ERROR, and two times the period of CLK_FB:

$$TFB2 = T0 + TSYNC\_ERROR + 2TFB \quad (8)$$

Thus, by substitution and simplification, MEAS2 is equivalent to:

$$MEAS2 = (T0 + 2TREF) - (T0 + TSYNC\_ERROR + 2TFB) \quad (9)$$

$$MEAS2 = 2TREF - TSYNC\_ERROR - 2TFB \quad (10)$$

The method 550 includes determining a period error T_ERROR by subtracting the first difference from the second difference (in step 558):

$$T\_ERROR = MEAS2 - MEAS1 \quad (11)$$

$$T\_ERROR = (2TREF - TSYNC\_ERROR - 2TFB) - (TREF - TSYNC\_ERROR - TFB) \quad (12)$$

$$T\_ERROR = TREF - TFB \quad (13)$$

Thus, by performing this subtraction technique, the phase error TSYNC_ERROR is removed from the period error T_ERROR, thereby providing a substantially accurate calculation of the period error. The controller 206 may then compare the calculated period error T_ERROR to the programmed threshold 256 (FIG. 2B) (in step 560) and may adjust a frequency of the primary clock signal CLK_DCO based on the comparison (in step 562), as described above with reference to FIG. 4. The period error may be determined using techniques other than the subtraction technique described above with reference to FIGS. 5A and 5B.

FIGS. 6-10 are a set of graphs depicting various functional aspects of the structures described herein. Each of these graphs is briefly described in turn.

The graph of FIG. 6 demonstrates benefits of the DFLLs described herein relative to other solutions. More specifically, FIG. 6 depicts the frequency spectra of the primary clock signal produced using the novel techniques described herein and a primary clock signal produced using other solutions. The graph indicates frequency (in MHz) on the x-axis and magnitude (in decibels (dB)) on the y-axis. Curve 1000 demonstrates the significant number of spikes that result when prior solutions (e.g., DPLL solutions) that entail continuous frequency and phase adaptation are used, as described above, and further when DCO frequency selection dithering techniques are used, as also described above. In contrast, curve 1002 demonstrates that with the DFLLs described herein, spikes are virtually eliminated. Because the spikes are virtually eliminated, buck converter output voltage ripple that results from such spikes (as described above) is also virtually eliminated, or is eliminated altogether.

Figure 7:
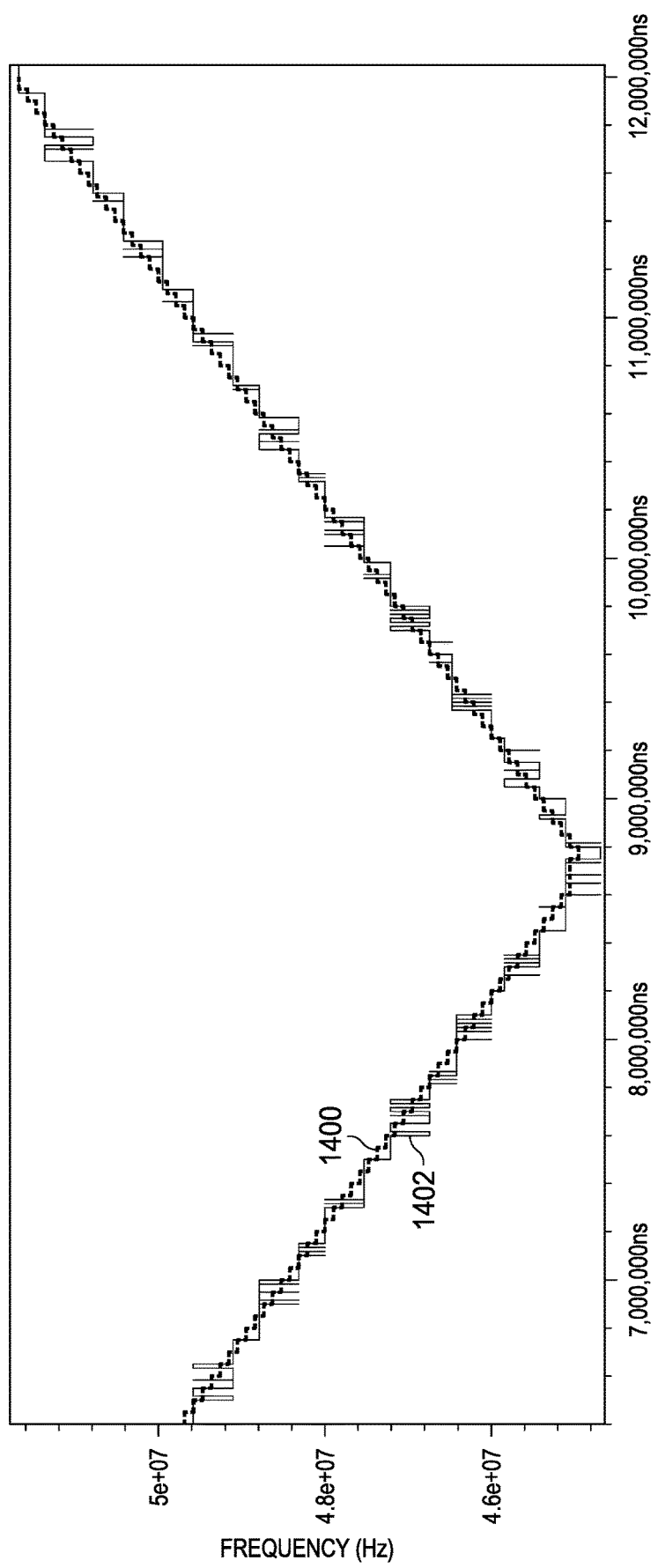

The graphs of FIGS. 7-9 demonstrate the importance of selecting a threshold value that is not too large or too small. A threshold value that is too small may cause frequent changes in the output signal frequency of the DFLL, and such frequent changes approximate the continuous adaptation described above with respect to other solutions. As described above, continuous adaptation (as it is performed in other solutions) results in frequent spurs, which are disadvantageous. The graph of FIG. 7 includes time (in nanoseconds) on the x-axis and frequency (in Hz) on the y-axis. The graph of FIG. 7 also shows a frequency sweep of a reference clock frequency multiplied by a feedback divider value of a feedback divider (curve 1400) and a DCO signal frequency (curve 1402) being matched to the curve 1400. A small threshold causes the DCO signal frequency to oscillate between values as shown, resulting in undesirable spurs. Conversely, FIG. 8 shows the effects of a threshold that is too large. The graph of FIG. 8 includes time (in nanoseconds) on the x-axis and frequency (in Hz) on the y-axis. The graph of FIG. 8 includes a curve 1500, which shows a frequency sweep of a reference clock frequency multiplied by a feedback divider value of a feedback divider, and a curve 1502, which represents a DCO signal frequency being matched to the curve 1500. As shown, an unduly large threshold results in undesirably infrequent changes to the DCO signal frequency such that the curve 1502 poorly matches the curve 1500. Further, in FIG. 8, the period error described above results in poor matching of the curve 1502 to the curve 1500. In contrast to FIGS. 7 and 8, the graph of FIG. 9 shows a threshold selected in between those of FIGS. 7 and 8 and a DFLL that mitigates the period errors prior to comparison with the threshold, consistent with the examples described herein. As shown in FIG. 9, in which the x-axis represents time in nanoseconds and the y-axis represents frequency in Hz, a curve 1602 (which represents a DCO signal frequency) closely approximates curve 1600 (which is a frequency sweep of the reference clock frequency multiplied by a feedback divider value of a feedback divider). This result is superior to those shown in FIGS. 7 and 8.

Figure 10:
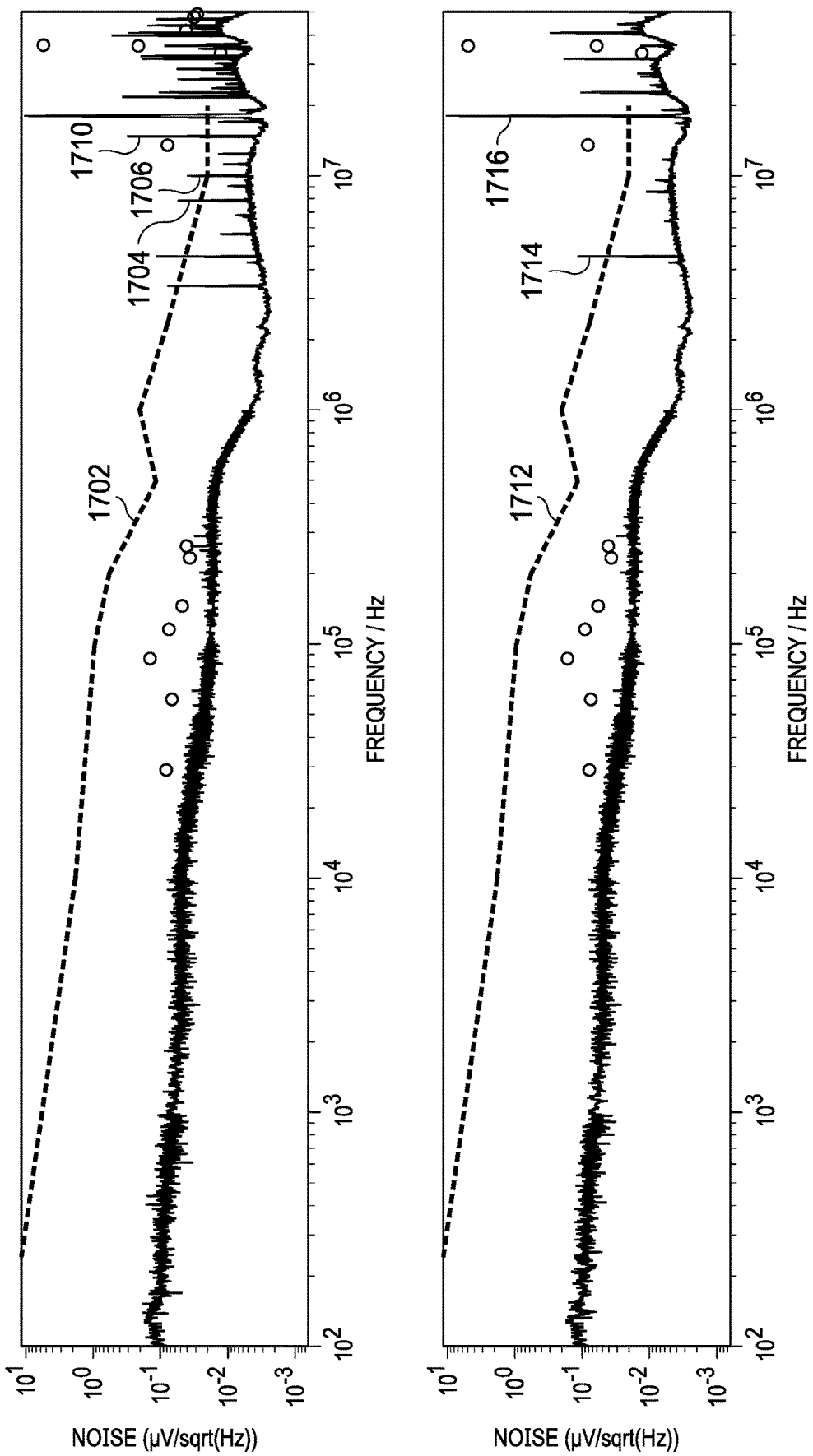

As described above, one goal in reducing spurs in the primary clock signal of the DFLL is to mitigate undesirable features, such as voltage ripple and noise, in buck converter outputs. FIG. 10 is a pair of graphs, each having frequency in Hertz on the x-axis and noise (in micro volts per square root of frequency $$\left(\frac{\mu V}{\sqrt{Hz}}\right)\right)$$

on the y-axis. The upper graph depicts a noise spectrum of a buck converter output signal when the example techniques described herein are not used. As shown, a maximum acceptable noise level 1702 is exceeded numerous times, such as at points 1704, 1706, and 1710. The lower graph depicts a noise spectrum of a buck converter output signal when the example DFLLs described herein are used. As shown, a maximum acceptable noise level 1712 is not exceeded. Point 1714 represents a noise spike caused by other factors not related to the spur problems described herein and that may be corrected by specific printed circuit board designs. Point 1716 is a spike that is above the radar frequency range and thus is irrelevant to example radar applications operating below 15 MHz (in some examples, radar applications may operate in the 20-30 MHz range and the buck switching frequency may be increased above the 20-30 MHz range to mitigate noise in the 20-30 MHz range). The graphs in FIG. 10 thus demonstrate the superiority of the example DFLLs described herein over other solutions.

Figure 11:
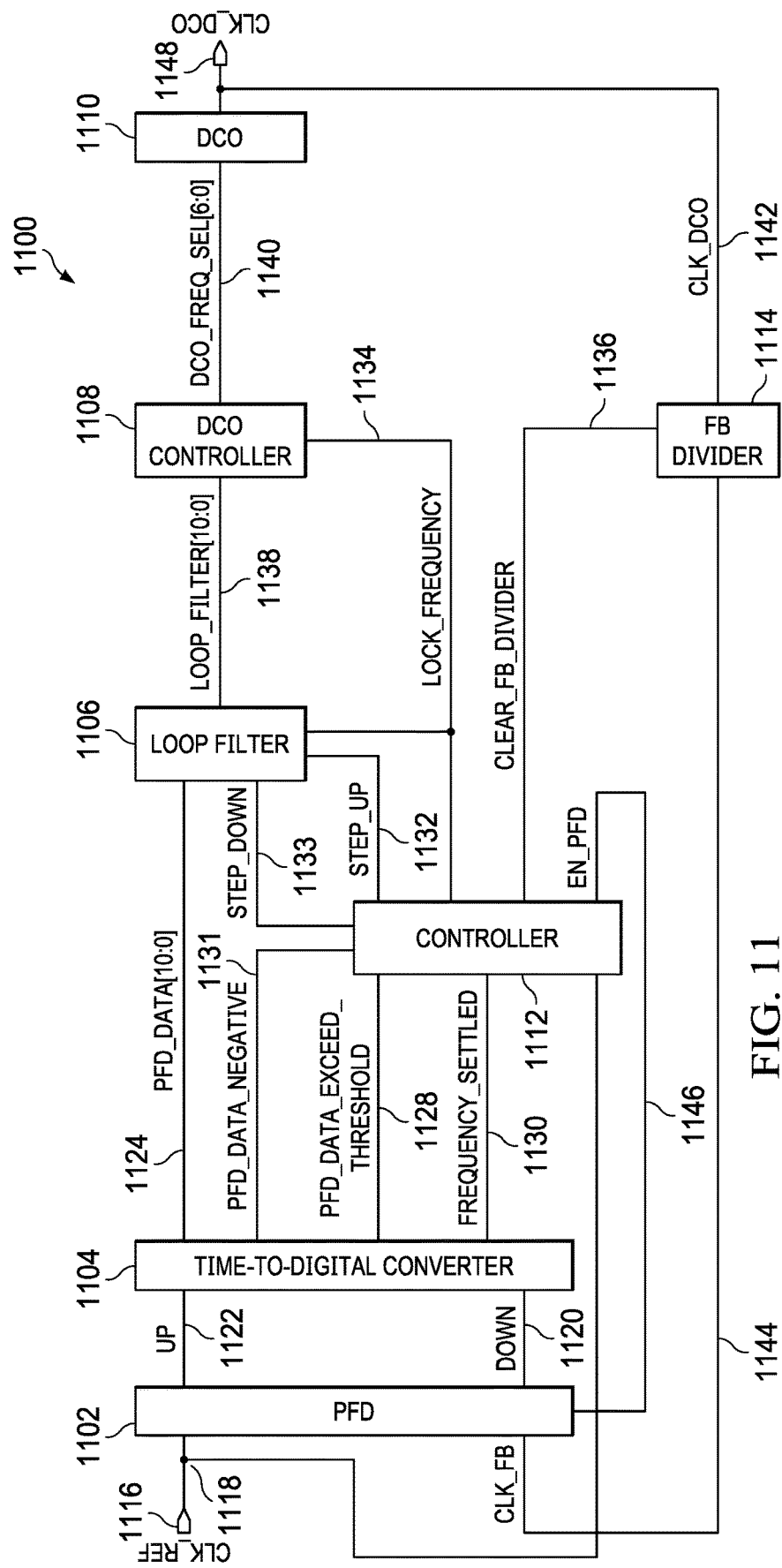
FIG. 11 is a block diagram of a DFLL in accordance with various examples.

FIG. 11 is a block diagram of another example DFLL. Features illustrated in FIG. 11 with the last two digits of their reference number being the same as the last two digits of the reference number of a feature illustrated in FIG. 2A (such as PFD 1102 and PFD 202) may be functionally and/or structurally the same or similar (e.g., the may be implemented using the same circuitry and/or software). A DFLL 1100 includes a PFD 1102; a TDC 1104 coupled to the PFD 1102; a loop filter 1106 coupled to the TDC 1104; a DCO controller 1108 coupled to the loop filter 1106; a DCO 1110 coupled to the DCO controller 1108; a controller 1112 coupled to the PFD 1102, the TDC 1104, the loop filter 1106, and the DCO controller 1108; and a feedback divider 1114 coupled to the DCO 1110 and controller 1112. An input 1116 is coupled to a node 1118, which is coupled to the PFD 1102 and the controller 1112. A reference clock CLK_REF is provided by way of the input 1116 and the node 1118. A down connection 1120 and an up connection 1122 are coupled between the PFD 1102 and the TDC 1104. The down connection 1120 and the up connection 1122 are analogous to the down connection 218 and the up connection 216, respectively, of FIG. 2A, and thus their operations are not described again here. The TDC 1104 is coupled to the loop filter 1106 by way of a PFD_DATA connection 1124, which is analogous to the PFD_DATA connection 220 of FIG. 2A.

The TDC 1104 is coupled to the controller 1112 by way of a PFD_DATA_EXCEED_THRESHOLD connection 1128, which indicates to the controller 1112 whether the period (or frequency) error threshold has been exceeded, and by a PFD_DATA_NEGATIVE connection 1131, which indicates whether the period has exceeded the period error threshold because the CLK_FB period is higher than the CLK_REF period or because the CLK_FB period is lower than the CLK_REF period. The TDC 1104 is also coupled to the controller 1112 by way of a FREQUENCY_SETTLED connection 1130, which indicates to the controller 1112 whether a phase and a frequency error have settled below a programmed target.

The controller 1112 is coupled to the loop filter 1106 by way of a STEP_UP connection 1132 and a STEP_DOWN connection 1133, which are usable to instruct the loop filter 1106 as to how the loop filter 1106 should adjust the signal on a LOOP_FILTER connection 1138 based on a comparison of the period error and the threshold, and a LOCK_FREQUENCY connection 1134, which indicates whether the loop filter 1106 should adjust the signal on LOOP_FILTER connection 1138 based on the signal on the STEP_UP and STEP_DOWN connections 1132, 1133 or based on the signal on PFD_DATA connection 1124. The signal on LOCK_FREQUENCY connection 1134 also indicates whether the DCO controller 1108 should dither the frequency of the primary clock signal based on the signal on LOOP_FILTER connection 1138. The controller 1112 is coupled to the feedback divider 1114 by a CLEAR_FB_DIVIDER connection 1136, which is analogous to the CLEAR_FB_DIV connection 226 of FIG. 2A. The controller 1112 is coupled to the PFD 1102 by way of an EN_PFD connection 1146, which is analogous to the EN_PFD connection 228 of FIG. 2A. The feedback divider 1114 is coupled to the PFD 1102 by way of a CLK_FB connection 1144. The loop filter 1106 is coupled to the DCO controller 1108 by way of the aforementioned LOOP_FILTER connection 1138, and the DCO controller 1108 is coupled to the DCO 1110 by way of a DCO_FREQ_SEL connection 1140, which is analogous to the DCO_FREQ_SEL connection 230 of FIG. 2A. The DCO 1110 is coupled to the feedback divider 1114 by way of a CLK_DCO connection 1142. The CLK_DCO connection 1142 is coupled to an output 1148, at which the primary clock signal is provided.

Figure 12:
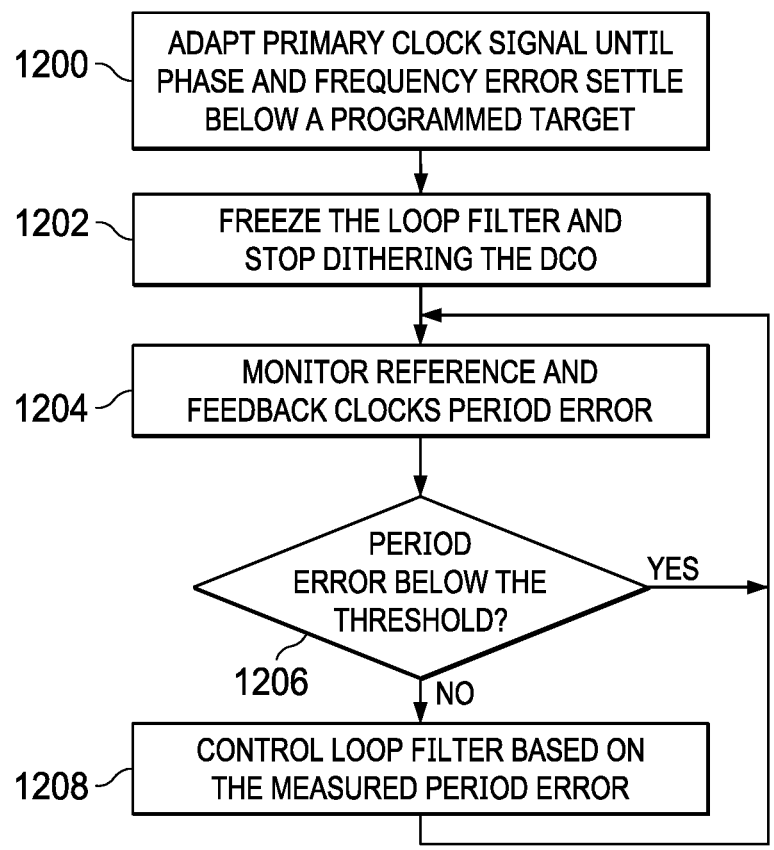
FIG. 12 is a flow diagram of a method for operating a DFLL in accordance with various examples.

The operation of the DFLL 1100 is described with reference to the method flow diagram of FIG. 12. The method begins with varying the primary clock signal provided by DCO 1110 to the output 1148 until both the phase and frequency error have settled below a programmed target (which may be stored, e.g., in the TDC 1104) (in step 1200). Specifically, the loop filter 1106 is adjusted based on the signal on the PFD_DATA connection 1124 and the DCO controller 1108 may dither the frequency of the primary clock signal based on the signal on LOOP_FILTER connection 1138. The PFD_DATA signal on the PFD_DATA connection 1124 may include a bit that indicates whether the CLK_FB frequency should be increased or decreased to better match CLK_REF. As the phase and frequency error drop below a programmed target, the signal on the FREQUENCY_SETTLED connection 1130 may rise from low to high. In response, the method includes freezing the loop filter and stopping the aforementioned dithering activity (in step 1202). Specifically, the controller 1112 may raise the LOCK_FREQUENCY connection 1134 from low (e.g., a logic low or a logic "0") to high (e.g., a logic high or a logic "1"), thereby locking the loop filter 1106 and the DCO controller 1108 such that the loop filter 1106 and DCO controller 1108 are no longer varying the frequency of the primary clock signal based on the signal on PFD_DATA connection 1124. Rather, the loop filter 1106 and DCO controller 1108 now vary the frequency of the primary clock signal based on the signal on STEP_UP and STEP_DOWN connections 1132, 1133. Whether the controller 1112 asserts the signals on the STEP_UP or STEP_DOWN connections 1132, 1133 depends on the signal on the PFD_DATA_NEGATIVE connection 1131, which, as explained, indicates whether the CLK_FB frequency should be increased or decreased to better match the CLK_REF frequency.

The method then includes the TDC 1104 monitoring the period error between the reference and feedback clocks, including the elimination of phase error in the period error, as described in detail above (in step 1204). The controller 1112 may use the CLEAR_FB_DIVIDER connection 1136 to clear the feedback divider 1114 to synchronize the rising edges of CLK_FB and CLK_REF, as described above with reference to FIG. 2A. By synchronizing CLK_FB and CLK_REF in this manner, the phase difference between the two clock signals is minimized, particularly if the synchronization is performed immediately prior to measurement of the period error. As a result, the dynamic range of the TDC 1104 need not be as large as it would otherwise have been.

The method includes the TDC 1104 determining whether the period error is below the threshold (in step 1206), and, if so, the signal on PFD_DATA_EXCEED_THRESHOLD connection 1128 is low, and control of the method returns to block 1204. However, if the period error rises above the threshold (1206), the method includes the controller 1112 controlling the loop filter 1106 based on the measured period error (in step 1208). Specifically, the PFD_DATA_EXCEED_THRESHOLD connection 1128 becomes high. The controller 1112 may adjust the loop filter 1106 by way of the STEP_UP and STEP_DOWN connections 1132, 1133 based on the measured period error, thereby causing the loop filter 1106 to adjust the digital value of LOOP_FILTER connection 1138. The adjusted digital value of the LOOP_FILTER connection 1138 enables the DCO controller 1108 to control the DCO 1110 to adjust the primary clock signal on output 1148 so the frequency of CLK_FB more closely matches the frequency of CLK_REF. The feedback divider 1114 may receive the primary clock signal (CLK_DCO) on CLK_DCO connection 1142 and divide the primary clock signal frequency by a divider value to produce a lower frequency feedback clock signal CLK_FB on the CLK_FB connection 1144.

FIG. 13 is a graph depicting the manner in which various components in the DFLL 1100 are controlled, in accordance with various examples. The graph indicates time (in nanoseconds) on the x-axis. For curves 1800 and 1802, the y-axis denotes frequency in Hz, and for curves 1804, 1806, 1808, and 1810, the y-axes denote digital bit value. The curve 1800 represents the reference clock signal frequency multiplied by the feedback divider value of the feedback divider 1114. The curve 1802 represents the primary clock signal CLK_DCO provided at output 1148. Curve 1804 represents the signal on the LOOP_FILTER connection 1138. Curve 1806 represents the threshold. Curve 1808 represents the signal on the PFD_DATA connection 1124. Curve 1810 represents the signal on DCO_FREQ_SEL connection 1140. The curve 1800 begins at a steady frequency, and because the frequency of the curve 1802 is sufficiently matched to that of curve 1800 (e.g., the periods of curves 1800, 1802 are sufficiently matched so that the period error is below the threshold), the curve 1802 is held constant by locking the loop filter 1106 and the DCO controller 1108. The fact that the period error remains below the threshold is represented by curve 1808 initially remaining below curve 1806. However, the curve 1808 does eventually exceed curve 1806, indicating that the period error has exceeded the threshold. In response, the loop filter 1106 is stepped, as shown in curve 1804. In response to the adjustment shown in curve 1804, curve 1810 is also adjusted. In response to the change in curve 1810, which represents a change in the signal on DCO_FREQ_SEL connection 1140 as described above, the frequency of the curve 1802 is reduced. Consequently, the period error as represented by curve 1808 drops below the threshold as represented by curve 1806. Each subsequent time the curve 1808 exceeds the curve 1806, the curves 1804 and 1810 are adjusted, causing the frequency of curve 1802 to drop, as shown. Each time the frequency of curve 1802 is adjusted, the curve 1808 drops below the curve 1806.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B. As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

What is claimed is:

1. A digital frequency locked loop (DFLL) device, comprising:
    a phase frequency detector (PFD) configured to receive a reference clock signal and an indicator of a primary clock signal and to determine differences between periods of the reference clock signal and the indicator;
    a controller coupled to the PFD, the controller configured to:
        store digital signals indicating a first and a second of the differences determined by the PFD;
        determine a period error by subtracting the second difference from the first difference; and
        compare the period error to a programmed threshold; and
    a digitally controlled oscillator (DCO) coupled to the controller, the DCO configured to provide the primary clock signal having a frequency adjusted based on the comparison.

2. The DFLL device of claim 1, wherein the primary clock signal having the adjusted frequency is spur-free.

3. The DFLL device of claim 1, further comprising a time-to-digital converter (TDC) coupled to the PFD and configured to digitize differences between periods of the reference clock signal and the indicator and configured to digitize differences between phases of the reference clock signal and the indicator.

4. The DFLL device of claim 1, wherein the PFD is configured to determine the first and second differences using consecutive rising edges of the indication and consecutive rising edges of the reference clock signal.

5. The DFLL device of claim 1, further comprising a digitally controlled oscillator (DCO) controller coupled to the controller, the DCO controller configured to receive a control signal from the controller based on the comparison, the control signal indicating how the frequency of the primary clock signal is to be adjusted.

6. The DFLL device of claim 1, wherein the DCO is configured to adjust the frequency of the primary clock signal in steps, each step corresponding to a fixed change in period.

7. The DFLL device of claim 6, wherein the programmed threshold is approximately half of the fixed change in period multiplied by a divider value of a feedback divider coupled to the controller.

8. The DFLL device of claim 1, wherein the controller is configured to synchronize the reference clock signal and the indicator prior to determining the period error.

9. A digital frequency locked loop (DFLL) device, comprising:
    a phase frequency detector (PFD) configured to receive a reference clock signal and an indication of the primary clock signal;
    a controller coupled to the PFD and configured to:
        determine a first difference between a first rising edge of the indication and a first rising edge of the reference clock signal;
        determine a second difference between a second rising edge of the indication and a second rising edge of the reference clock signal;
        determine a period error by subtracting the first difference from the second difference; and
        compare the period error to a programmed threshold; and
    a digitally controlled oscillator (DCO) coupled to the controller and configured to adjust a frequency of the primary clock signal based on the comparison.

10. The DFLL device of claim 9, wherein the first and second rising edges of the indication are consecutive, and wherein the first and second rising edges of the reference clock signal are consecutive.

11. The DFLL device of claim 9, wherein the second rising edge of the indication is consecutive with the first rising edge of the indication and the second rising edge of the reference clock signal is consecutive with the first rising edge of the reference clock signal.

12. The DFLL device of claim 9, wherein the primary clock signal having the adjusted frequency is spur-free.

13. The DFLL device of claim 9, wherein the DCO is configured to adjust the frequency of the primary clock signal in steps, each step corresponding to a fixed change in frequency.

14. The DFLL device of claim 13, wherein the programmed threshold is approximately half of the fixed change in frequency multiplied by a divider value of a feedback divider coupled to the controller.

15. The DFLL device of claim 9, wherein the PFD, the controller, and a feedback divider coupled to the DCO are configured to be cleared prior to the determination of the first difference.

16. A power management integrated circuit (PMIC), comprising:
    a switched mode power supply (SMPS) configured to produce a voltage based on a primary clock signal; and
    a digital frequency locked loop (DFLL) coupled to the SMPS and configured to:
        receive a reference clock signal and an indication of the primary clock signal;
        determine a first difference between a first rising edge of the indication and a first rising edge of the reference clock signal;
        determine a second difference between a second rising edge of the indication and a second rising edge of the reference clock signal, the second rising edge of the indication consecutive with the first rising edge of the indication and the second rising edge of the reference clock signal consecutive with the first rising edge of the reference clock signal;

determine a period error by subtracting the first difference from the second difference;

compare the period error to a programmed threshold; and based on the comparison, adjust a frequency of the primary clock signal.

17. The PMIC of claim 16, wherein the SMPS has a switching frequency that is higher than a radar frequency of 15 MHz.

18. The PMIC of claim 16, wherein the DFLL is configured to synchronize the indication of the primary clock signal to a rising edge of the reference clock signal.

19. The PMIC of claim 16, wherein the DFLL is configured to clear a phase frequency detector (PFD) and a feedback divider of the DFLL prior to determining the first difference.

20. The PMIC of claim 16, wherein the DFLL is configured to adjust the frequency of the primary clock signal in steps, each step corresponding to a fixed change in frequency, and wherein the programmed threshold is approximately half of the fixed change in frequency multiplied by a feedback divider value of a feedback divider of the DFLL.

* * * * *